United States Patent
Fujii et al.

(10) Patent No.: US 8,974,626 B2
(45) Date of Patent: Mar. 10, 2015

(54) METHOD OF MANUFACTURING MICRO STRUCTURE, AND SUBSTRATE STRUCTURE

(75) Inventors: Takamichi Fujii, Kanagawa-ken (JP); Akihiro Mukaiyama, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 984 days.

(21) Appl. No.: 13/069,154

(22) Filed: Mar. 22, 2011

(65) Prior Publication Data

US 2011/0236659 A1 Sep. 29, 2011

(30) Foreign Application Priority Data

Mar. 23, 2010 (JP) ................................. 2010-066521

(51) Int. Cl.
*B29C 65/00* (2006.01)
*H01L 21/00* (2006.01)
(Continued)

(52) U.S. Cl.
CPC . *B32B 7/02* (2013.01); *B81C 3/004* (2013.01); *B32B 2457/14* (2013.01); *B81B 2201/13* (2013.01); *B81B 2203/0338* (2013.01); *B81B 2207/07* (2013.01)
USPC .......... 156/307.7; 438/118; 438/119; 439/65; 439/66; 439/91; 29/825; 29/829; 29/830; 174/259

(58) Field of Classification Search
CPC .................. B32B 7/02; B32B 2457/14; B81C 2203/03–2203/038
USPC .................. 439/66, 91, 65; 29/825, 829, 830; 438/118, 119; 174/259; 156/307.7, 156/182, 297, 308.2; 216/13–21
See application file for complete search history.

(56) References Cited

U.S. PATENT DOCUMENTS

| 5,017,738 A | 5/1991 | Tsuji et al. |
| 6,800,223 B2 * | 10/2004 | Kojo et al. ..................... 252/514 |
| 2003/0017654 A1 | 1/2003 | Iwamoto |

(Continued)

FOREIGN PATENT DOCUMENTS

| JP | 2-246130 A | 10/1990 |
| JP | 6-77229 A | 3/1994 |

(Continued)

OTHER PUBLICATIONS

Japanese Office Action dated Aug. 26, 2013 issued in corresponding Japanese Patent Application No. 2010-066521.

*Primary Examiner* — John Goff
*Assistant Examiner* — Carson Gross
(74) *Attorney, Agent, or Firm* — Birch, Stewart, Kolasch & Birch, LLP

(57) ABSTRACT

A method of manufacturing a micro structure, includes the steps of: preparing separate first and second substrates, the first substrate having a first surface on which a first structural body having a first height and a second structural body having a second height greater than the first height of the first structural body are arranged, the second substrate having a second surface; then placing the first and second substrates to cause the first and second surfaces to face each other across the first and second structural bodies; and then bonding the first and second substrates to each other while compressing the second structural body in a height direction thereof between the first and second surfaces to cause the second structural body to have a height defined by the first structural body.

9 Claims, 9 Drawing Sheets

(51) Int. Cl.
  *B32B 7/02* (2006.01)
  *B81C 3/00* (2006.01)

(56) References Cited

U.S. PATENT DOCUMENTS

2005/0161814 A1  7/2005  Mizukoshi et al.
2009/0186425 A1  7/2009  Mizukoshi et al.

FOREIGN PATENT DOCUMENTS

| JP | 6-209028 A | 7/1994 |
| JP | 2003-31612 A | 1/2003 |
| JP | 2003-174055 A | 6/2003 |
| JP | 2005-216508 A | 8/2005 |
| JP | 2008-177404 A | 7/2008 |
| JP | 2008177404 A * | 7/2008 |
| WO | WO 2004/061935 A1 | 7/2004 |

* cited by examiner

METHOD OF MANUFACTURING MICRO STRUCTURE, AND SUBSTRATE STRUCTURE

BACKGROUND OF THE INVENTION

1. Field of the Invention

The present invention relates to a method of manufacturing a micro structure and to a substrate structure, and more particularly, to Micro Electro Mechanical System (MEMS) technology and a substrate structure suitable for manufacturing a micro structure having a height of the micrometer (μm) order or the nanometer (nm) order, such as bumps for electrical connections, flow channel structures for passing fluid, and various devices.

2. Description of the Related Art

Japanese Patent Application Publication No. 06-077229 discloses a method of forming a bump (which corresponds to a micro structure) on an electrode pad arranged on a semiconductor device on a wafer, in which a height positioning seat is arranged as a core member inside the bump in order to increase the positional accuracy in the height direction of the bump. The height positioning seat used as the core member is made of a material that does not melt at the melting point of the bump material (Pb—Sn 60 wt %), and when the bump material is melted in bonding process of the semiconductor device and a circuit board, the height positioning seat acts as a spacer in the height direction and maintains a prescribed dimension. Japanese Patent Application Publication No. 06-077229 describes only the relationship between the melting points of the inner material (height positioning seat) and the outer material (bump material), as material properties. However, the relationship between other factors is not specified, and it may not be possible to achieve sufficient flatness according to differences in hardness between the inner material and the outer material.

Japanese Patent Application Publication No. 06-209028 discloses a method including a step of pressing the upper faces of bumps formed on a semiconductor chip with a pressing tool having a flat pressing face so as to achieve uniform height of the bumps before mounting the semiconductor chip on a substrate, in order to reduce contact defects caused by variation in the height of the bumps. This method requires the pressing tool in order to achieve uniform bump height, and the manufacturing process is complicated. Moreover, there are cases where it is not possible to sufficiently eliminate height non-uniformities (variations) by means of the pressing method.

Japanese Patent Application Publication No. 2005-216508 discloses a composition of a metal paste capable of forming bumps having little variation in hardness and a suitable soft hardness, and a method of forming bumps using the metal paste. According to this method, flexible bumps (bumps which are soft as possible within the required hardness range) are manufactured by using the metal paste that does not contain glass frit and by adjusting the calcination density. In this method, when manufacturing bumps having a low calcination density, there is a problem in that the strength of each column (bump) is insufficient, and so on. Furthermore, Japanese Patent Application Publication No. 2005-216508 makes no mention of a method for making the height of the bumps uniform and there may be cases where the bumps cannot be bonded parallel when the substrates are pressed to each other.

WO 2004/061935 discloses a method including a cutting process using a bit in order to level the height of fine bumps formed on a substrate. In this method, the leveling is performed in such a manner that the surfaces of bumps and the surface of an insulating film (resist mask) are continuous and flush, by employing the cutting process using the bit instead of chemical mechanical polishing (CMP), whereupon the insulating film is removed. However, the steps involved in this method are complicated, and cut debris, and the like, arises and can cause contamination.

In various micro structures which are not limited to the bumps described above, if the height of a micro structure is relatively high and a substrate, or the like, is bonded thereon, then height non-uniformities (uneven height) present a problem. Moreover, if a micro structure has narrow width and large height and is bonded by application of pressure, then the column portions of the micro structure bend and break during the course of bonding, and accurate bonding is not possible.

SUMMARY OF THE INVENTION

The present invention has been contrived in view of these circumstances, an object thereof being to provide a method of manufacturing a micro structure, and a substrate structure, whereby a plurality of micro structures having uniform height throughout a substrate can be manufactured and stable bonding characteristics can be achieved.

In order to attain the aforementioned object, the present invention is directed to a method of manufacturing a micro structure, comprising the steps of preparing separate first and second substrates, the first substrate having a first surface on which a first structural body having a first height and a second structural body having a second height greater than the first height of the first structural body are arranged, the second substrate having a second surface; then placing the first and second substrates to cause the first and second surfaces to face each other across the first and second structural bodies; and then bonding the first and second substrates to each other while compressing the second structural body in a height direction thereof between the first and second surfaces to cause the second structural body to have a height defined by the first structural body.

According to this aspect of the present invention, the height ($h_2$) of the second structural body is greater than the height ($h_1$) of the first structural body (i.e., $h_2 > h_1$) in a state before bonding together the first and second substrates. When the first and second substrates are bonded together, the second structural body is compressed in the height direction thereof, and the height of the compressed second structural body is governed by the first structural body interposed between the first and second substrates. More specifically, the amount of deformation of the second structural body in the height direction due to compression is limited by the height of the first structural body. Therefore, it is possible to ensure that the height of the structural body formed between the first and second substrates after compression and deformation is a uniform height (a height defined by the first structural body).

The first structural body functions as a height adjustment structural body that defines the height of the micro structure formed between the substrates. The second structural body constitutes a structural body (micro structural body) having this adjusted height. The first structural body and the second structural body can be arranged in plural fashion on the same substrate. Even if there is height variation in the plurality of second structural bodies in the state before bonding, it is possible to bond the first and second substrates to each other satisfactorily with the height accuracy of the first structural bodies.

Furthermore, according to this aspect of the present invention, it is possible to bond the first and second substrates together while ensuring a uniform height (distance between the substrates), without being affected by warping of the substrates.

Preferably, the second structural body is constituted of a porous structural body; and in the boding step, the first and second substrates are pressed to each other.

The porous structural body is deformed (compressed) due to the application of pressing force. According to this aspect of the present invention, when the first and second substrates are bonded together while applying the pressing force, since the first structural body for height adjustment is interposed between the substrates, it is possible to achieve uniform application of pressure, and abnormal deformation, such as bending or breaking of the porous structural body during the bonding process can be prevented.

Preferably, a density of the second structural body before the bonding step is lower than the density of the second structural body after the bonding step.

The second structural body which is higher than the height ($h_1$) of the first structural body has raised density due to the compression (this can also be expressed as reduction in the void ratio).

Preferably, in the boding step, the second structural body is compressed in the height direction thereof by pressing force applied between the first and second substrates; and the first structural body is made of a material which exhibits a lower level of deformation than a material of the second structural body when a same pressing force is applied to the first and second structural bodies.

If the pressing force is applied during bonding of the first and second substrates, desirably, the amount of deformation of the first structural body forming the reference for height adjustment is sufficiently small with respect to the amount of deformation of the second structural body.

The deformation rate of the structural body can be compared generally on the basis of the Young's modulus of the material.

Preferably, the second structural body is made of a material containing metal particles.

For example, it is possible to obtain the second structural body by, for instance, using a metal paste in which metal particles are dispersed in a dispersion medium, such as an organic solvent, and then drying this paste.

Preferably, the first structural body is made of a photocurable resin.

According to this aspect of the present invention, it is possible to form the first structural body with good accuracy by using a photolithography technique.

Preferably, a filling ratio of the second structural body after the bonding step is not less than 40%.

Preferably, before the bonding step, the first and second structural bodies are arranged on the first surface of the first substrate without being in contact with each other.

A desirable mode is one where the first and second structural bodies on the first substrate in the state before bonding are arranged on the first substrate at an interval apart (with a prescribed gap therebetween). When the second structural body is deformed by pressing and squashing during the bonding process, then deformation in the lateral direction (the planar direction perpendicular to the height direction) can be tolerated within the range of this gap, and it is possible to prevent unwanted stress from being applied to the first structural body.

Preferably, in the preparing step, a third structural body having a third height and a fourth structural body having a fourth height greater than the third height of the third structural body are arranged on the second surface of the second substrate; in the placing step, the first and second substrates are placed to cause the first and third structural bodies to face each other and the second and fourth structural bodies to face each other; and in the bonding step, the first and second substrates are bonded to each other while compressing the second and fourth structural bodies in the height direction thereof between the first and second surfaces to transform the second and fourth structural bodies to a structural body having a height defined by the first and third structural bodies.

A substrate having a flat surface can be used as the second substrate, or a substrate having one or more of structural bodies incorporating surface undulations can also be used as the second substrate. According to this aspect of the present invention, a substrate structure having the structural body which is the same as or similar to the first substrate is used for the second substrate. The first height ($h_1$) of the first structural body and the third height ($h_3$) of the third structural body can be the same or different. The second height ($h_2$) of the second structural body and the fourth height ($h_4$) of the fourth structural body can be the same or different.

By bonding together these two substrates having the same or similar structural bodies, it is possible to satisfactorily manufacture a micro structure having a relatively large height.

In order to attain the aforementioned object, the present invention is also directed to a substrate structure, comprising: a substrate; a first structural body which is arranged on a surface of the substrate, the first structural body having a first height; and a second structural body which is arranged on the surface of the substrate, the second structural body having a second height greater than the first height of the first structural body, the second structural body being constituted of a porous structural body, the second structural body being configured to be compressed in a height direction thereof while a void ratio of the porous structural body decreases when pressing force is applied to the second structural body in the height direction thereof, wherein the first structural body is made of a material which exhibits a lower level of deformation than a material of the porous structural body of the second structural body when a same pressing force is applied to the first and second structural bodies.

The substrate structure according to this aspect of the present invention can be used in any of the above-described methods.

In order to attain the aforementioned object, the present invention is also directed to a method of manufacturing a micro structure, comprising the steps of: preparing separate first and second substrates, the first substrate having a first surface on which a first structural body having a first height is arranged, the second substrate having a second surface on which a second structural body having a second height greater than the first height of the first structural body is arranged; then placing the first and second substrates to cause the first and second surfaces to face each other across the first and second structural bodies; and then bonding the first and second substrates to each other while compressing the second structural body in a height direction thereof between the first and second surfaces to cause the second structural body to have a height defined by the first structural body.

According to this aspect of the present invention, similar actions and beneficial effects to the previously described methods are obtained. It is also possible to adopt a mode in which any of the previously described aspects is appended to this aspect.

According to the present invention, it is possible to manufacture a structure having a uniform height over the whole face of the substrate. Moreover, according to the present invention, it is possible to bond the substrates together at a uniform height, and the adhesion stability can be improved, without being affected by warping of the substrates.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

First Embodiment

Figure 1:
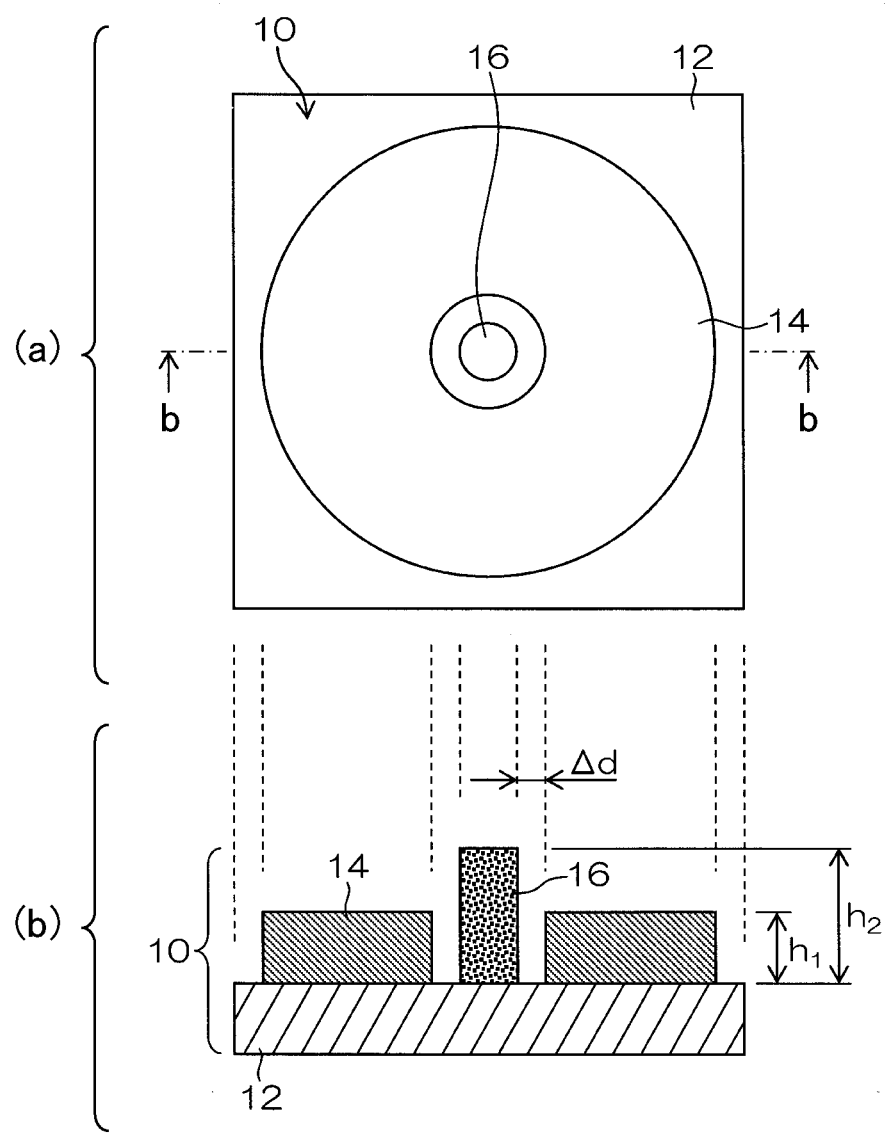
FIG. 1 is a schematic drawing of the principal composition of a substrate structure according to a first embodiment of the present invention.

FIG. 1 is a schematic drawing of a substrate structure according to a first embodiment of the present invention. In FIG. 1, portion (a) is a plan view of the substrate structure 10 and portion (b) is a cross-sectional view along line b-b in the portion (a). In FIG. 1, the dimensions (width, height, etc.) of various members are altered suitably for the purpose of the description, and do not reflect the actual sizes and dimensional ratios.

The substrate structure 10 shown in FIG. 1 includes a structural body 14 for height adjustment (hereinafter referred to as the "height adjustment structural body") and a columnar porous structural body 16 (hereinafter referred to as the "porous column") formed on a wafer 12 of silicon (Si).

A plurality of height adjustment structural bodies 14 and a plurality of porous columns 16 are arranged on the wafer 12; however, in FIG. 1, only one pair of the height adjustment structural body 14 and the porous column 16 are shown. The height adjustment structural body 14 has a uniform height $h_1$ above the surface of the wafer 12. On the other hand, the porous column 16 has a height $h_2$ above the wafer 12, which is greater than the height $h_1$ of the height adjustment structural body 14 (i.e., $h_2 > h_1$). The porous column 16 is erected at a distance (gap) of $\Delta d$ (where $\Delta d > 0$) from the edges of the height adjustment structural body 14.

The height adjustment structural body 14 in the present embodiment has the ring shape surrounding the periphery of the porous column 16; however, there are no particular restrictions on the shape of the height adjustment structural body 14. Provided that the height adjustment structural body 14 has a flat height adjusting surface (the upper end face of the height adjustment structural body 14) that has a prescribed height of $h_1$, it is possible to display the height adjustment functions intended in the present embodiment, and therefore the planar shape of the height adjustment structural body can adopt various different modes.

In FIG. 1, the wafer 12 corresponds to a "first substrate" or "substrate", the height adjustment structural body 14 corresponds to a "first structural body", and the porous column 16 corresponds to a "second structural body".

It is desirable that the height adjustment structural body 14 does not greatly deform when bonding force is applied during the substrate bonding process which is described below with reference to FIGS. 2A and 2B. Although it depends on the pressing force applied in the bonding process, taking account of the pressure generally applied during the bonding process, the Young's modulus of the height adjustment structural body 14 is desirably not less than 1 GPa. If the Young's modulus of the height adjustment structural body 14 is less than 1 GPa, then it is envisaged that the height adjustment structural body 14 deforms and it becomes not possible to apply pressure uniformly to the whole face of the wafer 12.

The distortion $\epsilon$ of the material having the Young's modulus E when a stress $\epsilon$ is applied can be expressed as $\epsilon = \sigma/E$. Hence, the distortion is smaller, the greater the Young's modulus, which is a property of the material. In the present embodiment, it is preferable that the Young's modulus of the height adjustment structural body 14 or the first structural body is not less than 1 GPa and more desirably not less than 2 GPa. If the Young's modulus is less than 1 GPa, then the material greatly deforms under the pressing force and cannot perform as the height adjusting layer. On the other hand, the porous column 16 or the second structural body can have the Young's modulus of not more than about ½ of the Young's modulus of the height adjustment structural body 14, before compression. This is because, if the Young's modulus of the porous column 16 is greater than ½ of the Young's modulus of the height adjustment structural body 14, then it is possible that the height adjustment structural body 14 and the porous column 16 simultaneously deform when compressed. After the compression, drying or calcination, the Young's modulus of the height adjustment structural body 14 and the Young's modulus of the porous column 16 can have any relationship.

Photocurable resin which is used widely in the field of semiconductor manufacture (for example, SU-8, which can be obtained from MicroChem Corp., Newton, Mass.) has a Young's modulus after curing of approximately 2 GPa. Therefore, it is possible to form the height adjustment structural body 14 from the photocurable resin of this kind. The usable material includes epoxy resin, acrylic resin, polyimide resin, or the like. Moreover, it is also possible to obtain a higher Young's modulus by including a filler in these materials. In particular, concrete examples of usable material include: SU-8 (made by MicroChem), TMMR S-2000 (made by Tokyo Ohka Kogyo), AZ4903 (made by AZ Electronic Materials), or the like.

The material of the height adjustment structural body 14 can be an organic material such as SU-8, or an inorganic material, such as etched silicon. Here, in order that the height adjustment structural body 14 displays the height adjusting function and the substrates are bonded together uniformly, the variation in the height of the plurality of height adjustment structural bodies 14 on the substrate is desirably not more than ±10% and more desirably not more than ±5%, in the whole face of the bonded member. The film thickness (height)

non-uniformity in a 6-inch wafer when employing a general photoresist which is used in the MEMS field generally has a precision of not more than ±5%.

With regard to the method of manufacture and material of the height adjustment structural body 14 or the first structural body, apart from the mode described above, the first structural body can also be manufactured by a plating method or vapor phase epitaxy. For example, it is possible to manufacture the first structural body from a metal, such as Ni, Au, Ag, Pd, Sn, or the like, or an alloy of these, by plating. Furthermore, it is also possible to form a metal layer by vapor phase epitaxy, such as sputtering, and to then pattern the metal layer by lithography.

The material of the porous column 16 can be a precious metal such as gold (Au), silver (Ag), palladium (Pd), or the like, or other metals, such as Cu, Sn, Pb, In, Cr, Zn, or combinations or alloys of a plurality of these, etc. Moreover, it is also possible to use a nano-wire shaped material.

Figure 2A:
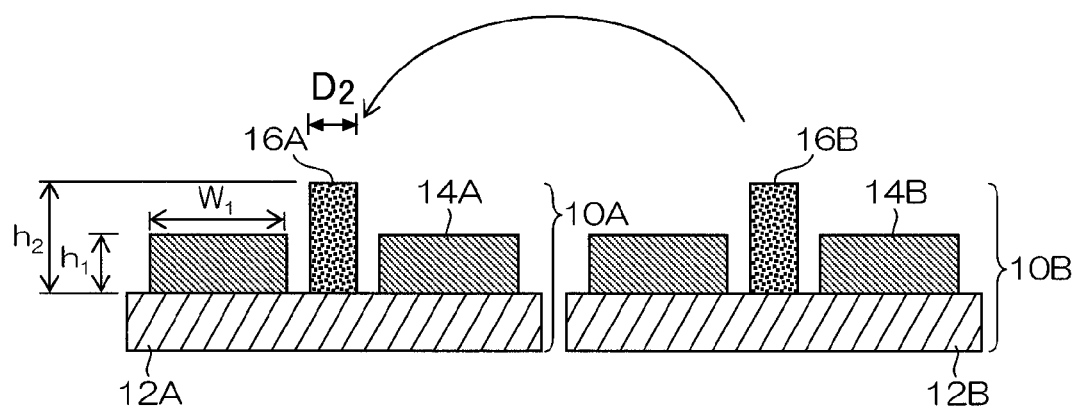
FIGS. 2A and 2B are schematic drawings showing a method of manufacturing a micro structure according to the first embodiment.
Figure 2B:
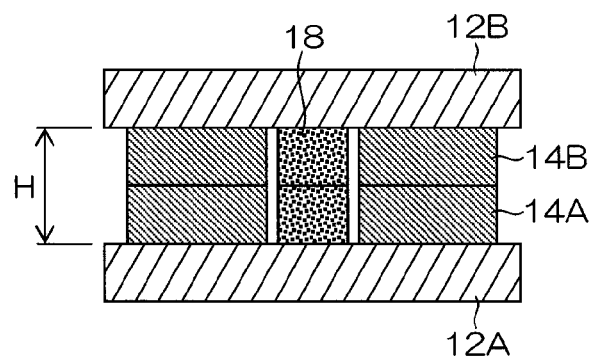

FIGS. 2A and 2B are schematic drawings showing the method of manufacturing the micro structure in the present embodiment. Here, an example is described in which two substrate structures 10A and 10B of the same structure having the composition described with reference to FIG. 1 are bonded together. In FIGS. 2A and 2B, the suffixes "A" and "B" are added after the reference numerals denoting the members in order to represent the different substrates. In FIGS. 2A and 2B, the wafer 12A corresponds to a "first substrate", and the height adjustment structural body 14A corresponds to a "first structural body" and the porous column 16A corresponds to a "second structural body". The wafer 12B corresponds to a "second substrate", the height adjustment structural body 14B corresponds to a "third structural body" and the porous column 16B corresponds to a "fourth structural body". The whole of the substrate structure 10B can be interpreted as the "second substrate".

As shown in FIG. 2A, the first substrate structure 10A and the second substrate structure 10B are prepared, these two structures are mutually superimposed with the height adjustment structural bodies 14A and 14B and the porous columns 16A and 16B in matching positions, and the structures are bonded together while applying pressure. Thereby, the porous columns 16A and 16B are bonded to each other while being squashed until reaching the height of the height adjustment structural bodies 14A and 14B (see FIG. 2B).

More specifically, the porous columns 16A and 16B are squashed (compressed) in the height direction by the pressing force, and a structural body 18 having a height H defined by the height adjustment structural bodies 14A and 14B is formed. The structural body 18 is obtained by deformation of the porous columns 16A and 16B.

The structural body 18 containing metal can be used as a wiring electrode, for example. Alternatively, by using hollow tubular porous columns as the porous columns 16A and 16B, it is possible to form a tubular structure (flow channel structure) through which fluid (liquid or gas) passes.

The height H of the structural body 18 is of the micrometer (μm) order or the nanometer (nm) order, and in the present specification, a structure of about this size is referred to as a "micro structure".

An example of the manufacturing method shown in FIGS. 2A and 2B is described below. The correspondences with respect to the members shown in FIGS. 2A and 2B are indicated by the reference numerals in parentheses.

EXAMPLE 1

Step 1: A height adjustment structural body (14A) was formed to the height $h_1=5$ μm and the width $W_1=100$ μm from photocurable resin (SU-8) on a 6-inch wafer (12A). Two thousand (2000) height adjustment structural bodies (14A) of this size were formed on the surface of the wafer (12A).

Step 2: Thereupon, using a metal paste containing micro particles of gold (Au), round bar-shaped porous columns (16A) having a height $h_2$=approximately 7 μm and diameter $D_2=300$ μm were formed between the height adjustment structural bodies (14A). The density of the porous columns 16A upon drying of the solvent was about 70% of bulk Au.

Another further substrate structure (10B) having the same composition as the substrate structure (10A) of the composition described above was also manufactured. More specifically, the two substrate structures (10A, 10B) having the same structure were manufactured.

Step 3: The two wafers (the substrate structures 10A and 10B) obtained in the step 2 were bonded together while being matched in position by an aligner, with their respective height adjustment structural bodies (14A, 14B) and the porous columns (16A, 16B) facing each other, and calcination was carried out at 200° C. while applying pressure (FIG. 2B).

Step 4: Thereby, the density of the porous columns (16A, 16B) was suitably raised until the height adjustment structural bodies (14A, 14B) were in contact with each other, and thus the Si wafers (12A, 12B) were bonded together.

Step 5: The wafers (12A, 12B) which was bonded together in this way were bonded satisfactorily and uniformly throughout the 6-inch surfaces. In other words, the porous columns (16A, 16B) were bonded together and the heights thereof were limited by the height adjustment structural bodies (14A, 14B).

In addition to the bonding function by the porous columns (16A, 16B), it is also possible to arrange a eutectic bonding material, such as Au—Sn, on the end faces (bonding surfaces) of the height adjustment structural bodies (14A, 14B), thereby imparting a bonding function also to the height adjustment structural bodies (14A, 14B) themselves.

In the embodiment described above, two silicon wafers having the same structure are bonded together; however, it is also possible to bond together wafers having different structures. Furthermore, the materials bonded together can be semiconductor chips (as described in Japanese Patent Application Publication No. 06-209028).

EXAMPLE 2

A more detailed example of a manufacturing process is described below, with reference to step diagrams of FIGS. 3A to 3I.

Step 1: Application of Photocurable Resin (FIG. 3A)

Figure 3A:
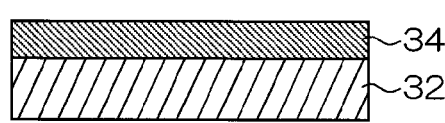
FIGS. 3A to 3I are step diagrams showing a manufacturing process for a micro structure according to an embodiment of the present invention.

As shown in FIG. 3A, firstly, SU-8 is applied onto a silicon substrate 32 to form a first structural body 34. Here, SU-8 is used to form the first structural body; however, the first structural body can also be formed from a plating material, or a film manufactured by gas phase epitaxy, or a film deposited by chemical solution deposition (CSD), such as sol gelation.

Step 2: Patterning and Curing of Photocurable Resin Layer (FIG. 3B)

Figure 3B:
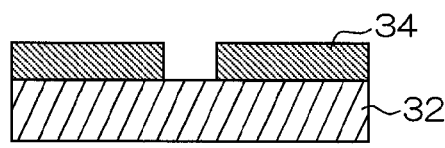

Next, as shown in FIG. 3B, the applied photocurable resin layer is patterned to a desired shape and then cured at 200° C. It is possible to select the patterning method and conditions and the curing and calcination conditions appropriately depending on the material.

It is desirable that the first structural body 34 is of uniform height throughout the whole face of the wafer. Variation in thickness (height direction) should be not more than ±10%, desirably, not more than ±5% and even more desirably, not more than ±3%. In the present example, although a second structural body (a porous column 46) acts as a buffer and enables height adjustment and reliable bonding, since the final height adjustment is performed using the first structural body 34, then desirably the first structural body 34 has greater height accuracy. Moreover, it is also possible to arrange an adhesive layer, such as Au or Au—Sn on the first structural body 34.

Step 3: Application of Resist onto the Pattern (FIG. 3C)

Figure 3C:
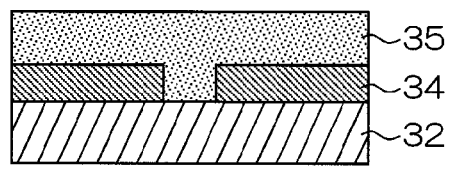

Next, as shown in FIG. 3C, resist 35 is applied to the pattern on the first structural body 34. More specifically, a resist layer 35 made of a material for performing the subsequent patterning step is formed over the first structural body 34.

Step 4: Patterning (FIG. 3D)

Figure 3D:
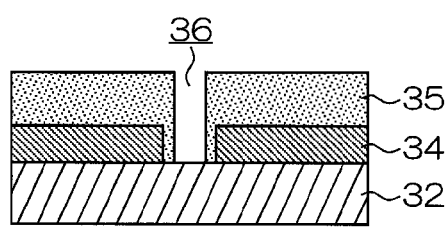

Next, as shown in FIG. 3D, the applied resist layer 35 is patterned. This pattern is for forming a porous structural body in the next step. It is also possible to employ methods other than the resist application, such as plating, sol gelation, vapor phase epitaxy, and the like, provided that patterning is possible. If these methods of depositing materials are used, then patterning, etching or lift-off should be performed after the deposition, again using photoresist, or the like.

Figure 3E:
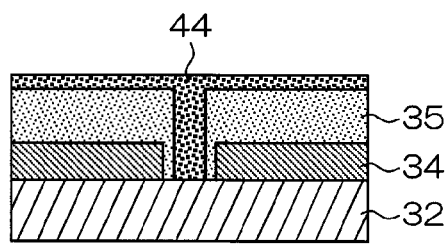

Step 5: Application of Material to Form Porous Structural Body and Preliminary Calcination (FIG. 3E)

Thereupon, a material 44 for forming a porous structural body is applied to the patterned section (i.e., a recess section 36) which has been patterned as described above (see FIG. 3E). In order that the material 44 is satisfactorily introduced into the recess section 36, this application step can be carried out in a reduced pressure atmosphere. After applying the material 44 described above, preliminary calcination is carried out at 80° C.

The material 44 of the porous structural body contains particles of metal (for example, Ag, Au, Cu, Pt, Pd, Zn, Al, In, or the like), a metal oxide, a metal nitride, or a mixture of these. The particle size can be of the nanometer order or the micrometer order. The particles can have a substantially spherical shape or a wire shape.

Step 6: Polishing (FIG. 3F)

Figure 3F:
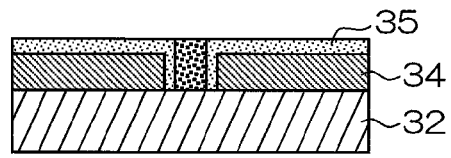

After forming the porous structural body in the step 5 above, the surface thereof is etched or polished to a certain extent, as shown in FIG. 3F, thereby achieving a uniform height throughout the whole face of the wafer. Although it is possible to omit this polishing step, performing the polishing step is advantageous in that it facilitates the task of lift-off after patterning. Furthermore, the non-uniformity of the heights of the porous structural bodies in the whole face of the wafer is desirably reduced by the etching or polishing process to not more than ±10%, and more desirably, not more than ±5%. If there is an undulating variation of 10% or more, then it is possible that uniformity will not be achieved upon bonding.

Figure 3G:
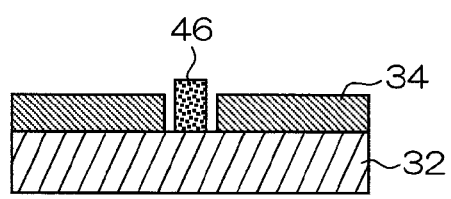

Step 7: Lift-Off Processing (FIG. 3G)

Next, the porous structural body is patterned by a lift-off technique. A porous structural body 46 (corresponding to a "second structural body") is obtained by this patterning process. A patterning method other than a lift-off technique can also be adopted.

Step 8: Alignment and Bonding (FIG. 3H)

Figure 3H:
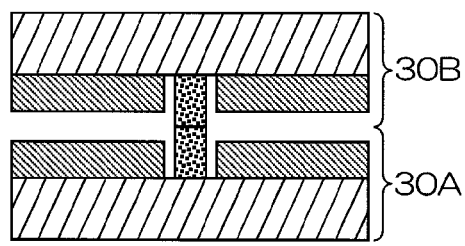

Preliminary attachment is performed by aligning, in an aligner, the silicon wafer obtained through the steps 1 to 7 above (the substrate structure 30A) and another separately prepared silicon wafer (here, the substrate structure 30B of the same structure obtained through the steps 1 to 7 above), (see FIG. 3H). The separately prepared wafer can be formed with a similar pattern or with a different structure.

Figure 3I:
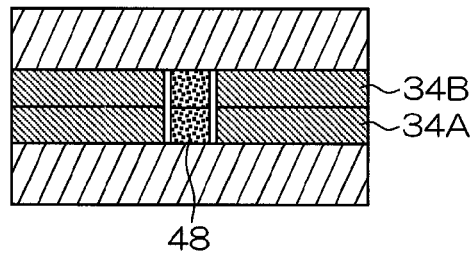

Step 9: Heating and Pressing (FIG. 3I)

After the preliminary attachment described above, bonding is performed by applying pressure to squash the porous columns 46 and applying heat. The pressing is carried out to an extent which does not cause the SU-8 layer (the first structural body 34) to undergo great deformation. In this case, the heating temperature is desirably not lower than 100° C. and desirably not higher than 300° C. At a temperature lower than 100° C., the bonding strength is weak. On the other hand, at a temperature above 300° C., the first structural body 34 can deform, and cracks and warping can occur due to stresses caused by the difference between the coefficients of thermal expansion of the respective materials.

Figure 4:
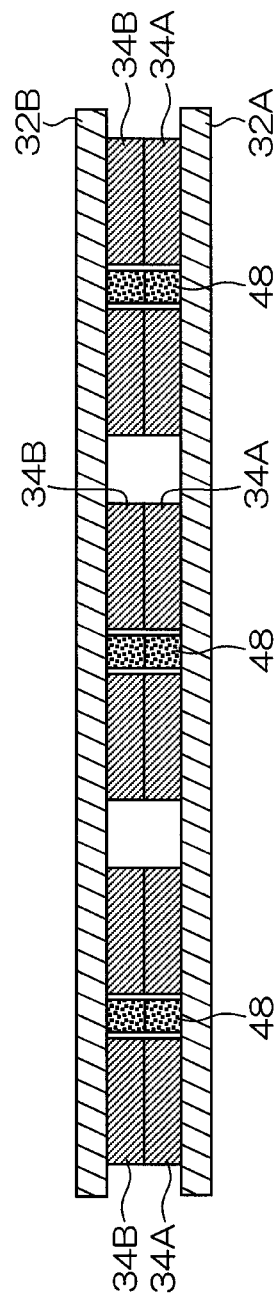
FIG. 4 is a schematic drawing of the structure manufactured by the manufacturing process in FIGS. 3A to 3I.

By means of the heating and pressing process in the step 9, finally, a structural body 48 is formed in which the height is adjusted by means of the first structural bodies 34A and 34B. As shown in FIG. 4, all of the porous columns between the wafers 32A and 32B have deformed similarly, and the structural bodies 48 of uniform height have been formed. In this way, it is possible to bond wafers together at a uniform height and without warping.

The porous structural bodies are compressed by the bonding process, and the compression ratio in the direction perpendicular to the bonded faces of the wafers is desirably not less than 30%. Here, the compression ratio is the ratio expressed as a percentage, of the amount of change in the dimension (D1) before the bonding and the dimension (D2) after the bonding of the porous structural bodies in the direction perpendicular to the bonded faces of the substrates (amount of compression) with respect to the dimension (D1) before the bonding, as follows:

$$\text{"Compression ratio"} = (|D2-D1|/D1) \times 100\ (\%).$$

This is because if the compression ratio in the direction perpendicular to the bonded faces of the substrates is less than 30%, then there is a possibility that adhesion is insufficient in the bonding process, and there is a possibility that the undulations between the upper and lower substrates are not absorbed sufficiently.

It is desirable that the filling ratio of the porous structural body 46 or the second structural body after bonding is high. Although there is no upper limit, a lower limit of approximately 40% is required. More desirably, the filling ratio of the second structural body after bonding is not less than 60%, and even more desirably, not less than 80%. If the filling ratio of the second structural body after bonding is less than 40%, then sufficient bonding strength is not obtained, and it is possible that displacement occurs due to force in the lateral direction. Moreover, if the second structural body is a conducting body, which passes electricity and serves a wiring function between the upper and lower substrates, then a higher density, in other words, a higher filling ratio is desirable since this lowers the electrical resistance.

According to the present embodiment, even if there is height variation in the porous columns 46 before bonding, it is still possible to achieve satisfactory bonding. Furthermore, when bonding the micro structures using the porous bodies, it is possible to prevent large deformation of the micro structures (bending or breaking) during the pressing and bonding process.

COMPARATIVE EXAMPLE

Figure 5A:
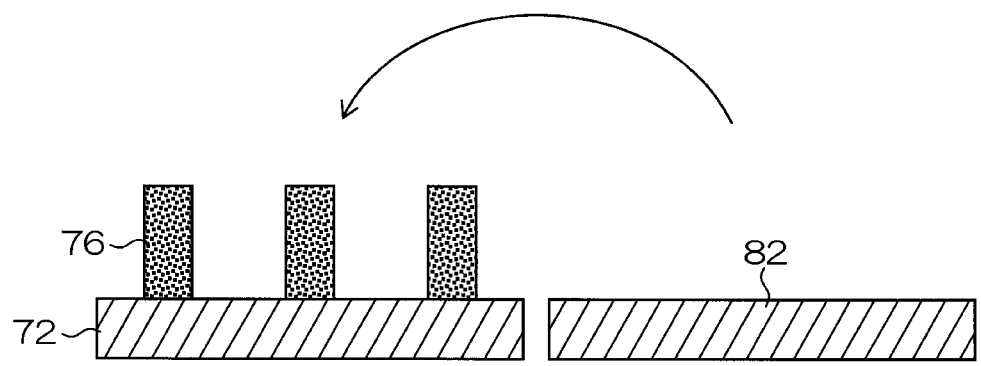
FIGS. 5A and 5B are illustrative diagrams of a comparative example.
Figure 5B:
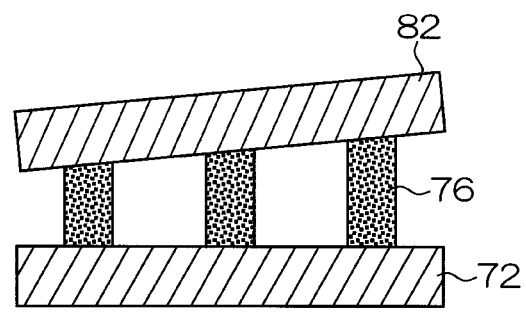

FIGS. 5A and 5B are illustrative diagrams showing a comparative example. Similarly to the first embodiment of the present invention, a plurality of porous columns 76 were formed on a 6-inch wafer 72 (see FIG. 5A). However, in this comparative example, no structural bodies corresponding to the height adjustment structural bodies 14 were arranged. Another 6-inch wafer 82 was placed over the wafer 72 on which the porous columns 76 had been formed, and was bonded thereto at 200° C. while applying pressure. In this case, as shown in FIG. 5B, variations arose in the amount of deformation of the porous columns 76, and there was non-uniformity in bonding within the bonded faces of the wafers (namely, a situation where the wafer 82 was inclined).

Second Embodiment

FIGS. 1A and 1B show the composition where the porous column 16 is erected on the inner side of the height adjustment structural body 14 which is ring-shaped in plan view; however, in implementing the present invention, the shape and arrangement of the height adjustment structural body and the porous column are not limited to this and can adopt various modes. Several modifications are described below.

Figure 6:
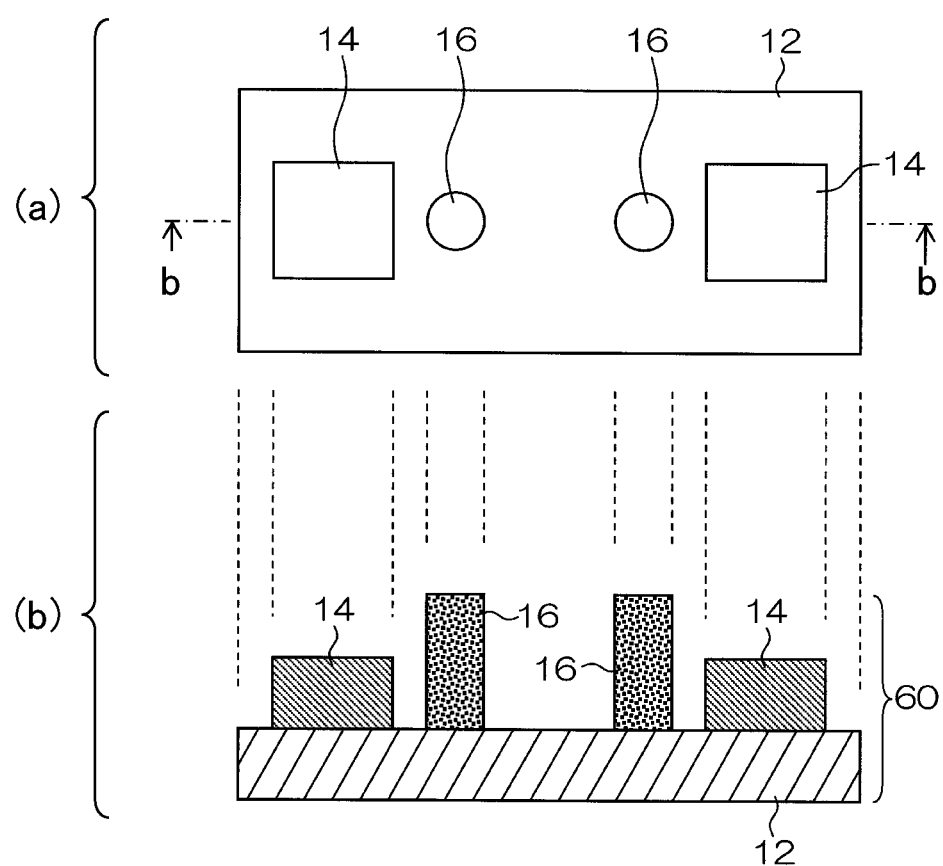
FIG. 6 is a schematic drawing of the principal composition of a substrate structure according to a second embodiment of the present invention.

FIG. 6 shows a substrate structure according to a second embodiment of the present invention. In FIG. 6, members which are the same as or similar to the first embodiment shown in FIG. 1 are denoted with the same reference numerals and further explanation thereof is omitted here. In FIG. 6, portion (a) is a plan view and portion (b) is a cross-sectional view along line b-b. In the substrate structure 60 shown in FIG. 6, the porous columns 16 are arranged between the height adjustment structural bodies 14 which are formed on the wafer 12.

Even with this mode, when the porous columns 16 are pressed and squashed during bonding, the height thereof is governed by the height adjustment structural bodies 14.

Third Embodiment

Figure 7:
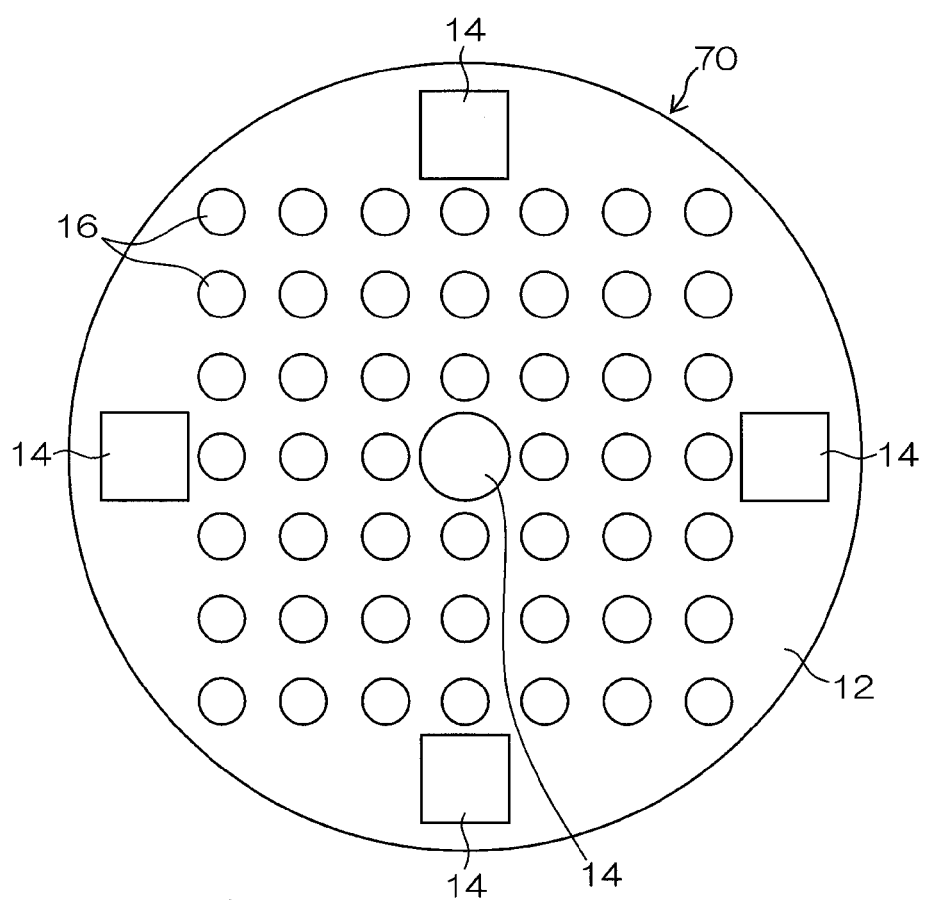
FIG. 7 is a schematic drawing of the principal composition of a substrate structure according to a third embodiment of the present invention.

FIG. 7 is a plan view of a substrate structure according to a third embodiment of the present invention. In FIG. 7, members which are the same as or similar to the first embodiment shown in FIG. 1 are denoted with the same reference numerals and further explanation thereof is omitted here. In the substrate structure 70 shown in FIG. 7, the height adjustment structural bodies 14 are arranged at five locations, namely, a central position on the wafer 12 and upper, lower, left-hand and right-hand positions in the outer perimeter of the wafer 12, and the porous columns 16 are arranged at the other positions on the surface of the wafer 12. The relationship between the number of porous columns 16 and the number of height adjustment structural bodies 14 is not necessarily a one-to-one correspondence, and it is possible to design the number, shape and arrangement of the height adjustment structural bodies 14 within a range which guarantees parallelism (uniform height) when two substrates are bonded together.

Fourth Embodiment

Figure 8A:
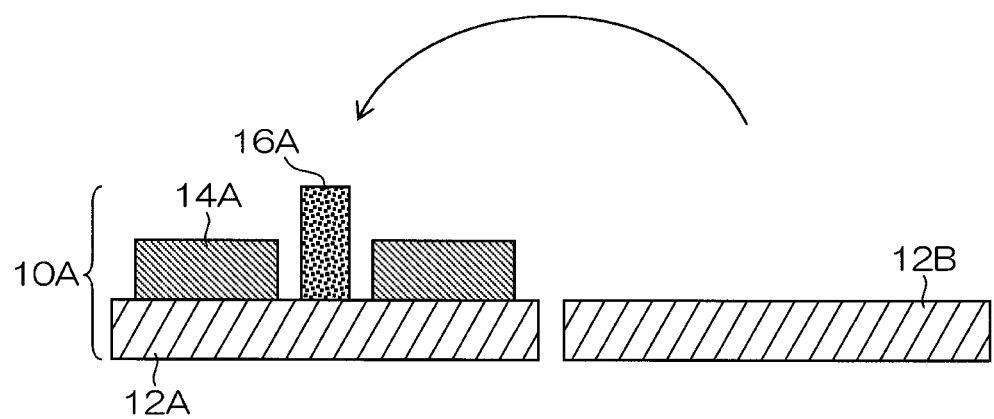
FIGS. 8A and 8B are schematic drawings showing a fourth embodiment of the present invention.
Figure 8B:
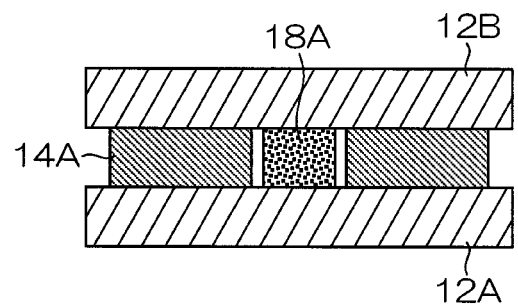

FIGS. 8A and 8B show a substrate structure according to a fourth embodiment of the present invention. In FIGS. 8A and 8B, members which are the same as or similar to the embodiment shown in FIGS. 2A and 2B are denoted with the same reference numerals and further explanation thereof is omitted here. In FIGS. 8A and 8B, a simple silicon wafer (substrate) 12B is bonded, rather than the substrate structure 10B shown in FIGS. 2A and 2B.

According to the composition shown in FIGS. 8A and 8B, it is possible to limit the amount of deformation of the porous columns 16A during bonding, by means of the height adjustment structural body 14A, and therefore the structural body 18A having uniform height can be obtained.

Fifth Embodiment

Figure 9A:
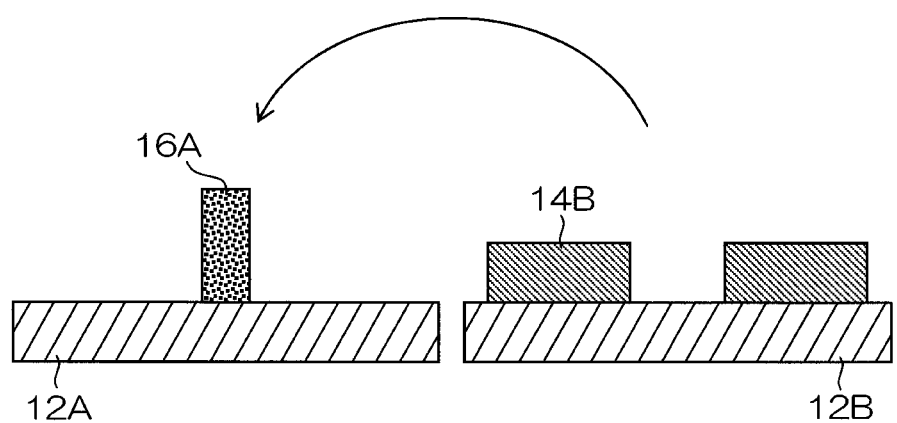
FIGS. 9A and 9B are schematic drawings showing a fifth embodiment of the present invention.
Figure 9B:
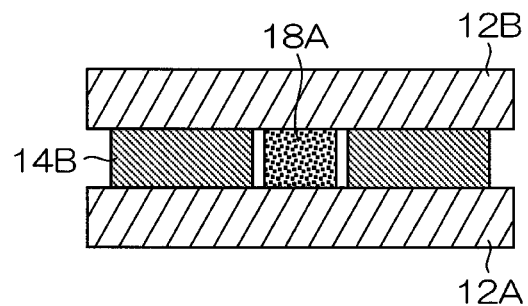

FIGS. 9A and 9B show a substrate structure according to a fifth embodiment of the present invention. In FIGS. 9A and 9B, members which are the same as or similar to the embodiments shown in FIGS. 2A, 2B, 8A and 8B are denoted with the same reference numerals and further explanation thereof is omitted here. In FIGS. 9A and 9B, the porous column 16A is formed on one wafer 12A, and the height adjustment structural body 14B is formed on another wafer 12B. Even with the composition where the porous column 16A and the height adjustment structural body 14B are formed on different wafers 12A and 12B in this way (see FIG. 9A), similar actions and beneficial effects to the embodiment shown in FIGS. 8A and 8B are obtained when the wafers are bonded together (see FIG. 9B).

Applications Of The Present Invention

The method of manufacturing a micro structure according to the present invention is suitable for forming a micro structure used as a wiring electrode (namely, a bump or a connecting electrode which passes through another member, or the like). Furthermore, the method of manufacturing a micro structure according to the present invention is suitable for forming a structure used as a flow channel for ink, or the like.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a micro structure, comprising the steps of:
    forming a first structural body having a first height on a first surface of a first substrate;
    then forming a second structural body on the first surface, the second structural body being porous and having a second height greater than the first height;
    then placing the first substrate and a second substrate having a second surface to cause the first and second surfaces to face each other across the first and second structural bodies; and
    then bonding the first and second substrates to each other by applying heat and pressing force to compress the second structural body in a height direction thereof between the first and second surfaces to cause the second structural body to have a height defined by the first structural body,
    wherein the second structural body forming step includes the steps of:
    forming a resist layer over the first structural body;
    then patterning the resist layer to form a recess section therein;
    then introducing a material of the second structural body into the recess section;
    then preliminarily calcining the material of the second structural body;
    then etching or polishing a surface of the material of the second structural body; and
    then removing the resist layer.

2. The method as defined in claim 1, wherein a density of the second structural body before the bonding step is lower than the density of the second structural body after the bonding step.

3. The method as defined in claim 1, wherein
    the first structural body is made of a material which exhibits a lower level of deformation than the material of the second structural body when a same pressing force is applied to the first and second structural bodies.

4. The method as defined in claim 1, wherein the material of the second structural body contains metal particles.

5. The method as defined in claim 1, wherein the first structural body is made of a photocurable resin.

6. The method as defined in claim 1, wherein a filling ratio of the second structural body after the bonding step is not less than 40%.

7. The method as defined in claim 1, wherein before the bonding step, the first and second structural bodies are arranged on the first surface of the first substrate without being in contact with each other.

8. A method of manufacturing a micro structure, comprising the steps of:
preparing separate first and second substrates, the first substrate having a first surface on which a first structural body having a first height and a second structural body having a second height greater than the first height of the first structural body are arranged, the second substrate having a second surface;
then placing the first and second substrates to cause the first and second surfaces to face each other across the first and second structural bodies; and
then bonding the first and second substrates to each other while compressing the second structural body in a height direction thereof between the first and second surfaces to cause the second structural body to have a height defined by the first structural body, wherein:
in the preparing step, a third structural body having a third height and a fourth structural body having a fourth height greater than the third height of the third structural body are arranged on the second surface of the second substrate;
in the placing step, the first and second substrates are placed to cause the first and third structural bodies to face each other and the second and fourth structural bodies to face each other; and
in the bonding step, the first and second substrates are bonded to each other while compressing the second and fourth structural bodies in the height direction thereof between the first and second surfaces to transform the second and fourth structural bodies to a structural body having a height defined by the first and third structural bodies.

9. The method as defined in claim 1, wherein:
the first structural body has a first end face in contact with the first surface of the first substrate and a second end face opposite to the first end face; and
the method further comprises the step of, before the bonding step, arranging a eutectic bonding material on the second end face of the first structural body thereby imparting a bonding function to the first structural body.

* * * * *